United States Patent [19]

Barnes

[11] Patent Number: 4,950,120
[45] Date of Patent: Aug. 21, 1990

[54] APPARATUS AND METHOD FOR FEEDING CARD EDGE CONNECTORS AND CONNECTOR MAGAZINES

[75] Inventor: Donald E. Barnes, Wilton, Conn.

[73] Assignee: Burndy Corporation, Norwalk, Conn.

[21] Appl. No.: 316,212

[22] Filed: Feb. 27, 1989

[51] Int. Cl.$^5$ .............................................. B65H 3/28
[52] U.S. Cl. ................................. 414/331; 414/797.7; 414/798.1; 221/75; 221/297; 221/222
[58] Field of Search ............... 414/797.7, 798, 798.1, 414/331, 787, 413; 198/467.1, 468.6, 621, 625; 221/75, 222, 223, 297, 298

[56] References Cited

U.S. PATENT DOCUMENTS

| | | | |
|---|---|---|---|
| 1,260,432 | 3/1918 | Nias | 221/297 X |
| 1,366,874 | 1/1921 | Christians | 259/78 |
| 1,950,382 | 3/1934 | Benson | 221/297 |
| 2,191,153 | 2/1940 | Harmon | 198/26 |
| 2,509,393 | 5/1950 | Kendall | 214/1 |
| 3,146,887 | 9/1964 | Mottin et al. | 209/73 |
| 3,289,858 | 12/1966 | Naumann | 214/1 |
| 3,308,977 | 3/1967 | Cochran et al. | 214/301 |
| 3,507,382 | 4/1970 | Wells | 198/625 |
| 3,656,605 | 4/1972 | Gess | 198/33 AA |
| 3,703,232 | 11/1972 | Zbiegien | 198/33 AD |
| 3,712,483 | 1/1973 | Messervey | 414/797.7 X |
| 3,862,702 | 1/1975 | Johnson et al. | 221/222 X |
| 3,866,741 | 2/1975 | Storimans | 198/459 |
| 4,044,896 | 8/1977 | Reinecke | 414/798.1 X |
| 4,429,807 | 2/1984 | Enders | 221/222 X |
| 4,599,026 | 7/1986 | Feiber et al. | 414/413 X |
| 4,601,386 | 7/1986 | Antonello | 414/787 X |
| 4,724,965 | 2/1988 | Willberg | 209/573 |
| 4,733,459 | 3/1988 | Tateno | 29/741 |
| 4,760,924 | 8/1988 | Sato et al. | 414/798 X |
| 4,761,106 | 8/1988 | Brown et al. | 414/413 X |
| 4,775,279 | 10/1988 | Linker | 414/411 |

FOREIGN PATENT DOCUMENTS

| | | | |
|---|---|---|---|
| 0239271 | 10/1960 | Australia | 221/297 |
| 1148789 | 5/1963 | Fed. Rep. of Germany | 221/222 |
| 1160265 | 12/1963 | Fed. Rep. of Germany | 221/297 |
| 2740921 | 3/1979 | Fed. Rep. of Germany | 221/222 |
| 0018668 | 2/1977 | Japan | 414/797.7 |
| 0172326 | 9/1984 | Japan | 414/413 |
| 0197518 | 10/1985 | Japan | 414/413 |
| 0246675 | 11/1986 | Japan | 414/331 |
| 0121126 | 6/1987 | Japan | 414/798 |
| 0157131 | 7/1987 | Japan | 414/331 |
| 2068916 | 8/1981 | United Kingdom | 414/797.7 |

Primary Examiner—Robert J. Spar
Assistant Examiner—John VandenBosche
Attorney, Agent, or Firm—Perman & Green

[57] ABSTRACT

A robotic feeding mechanism for feeding electrical connectors. Connector magazines having a plurality of electrical connectors therein can be held in a magazine feeder which comprises at least two worm gears for holding and moving connector magazines therebetween. The magazine feeder also comprises gates for holding a connector magazine received from the worm gears for dispensing individual connectors and means for operably moving the worm gears and gates for controllably advancing connector magazines towards the gates and moving the gates to replace an empty magazine with a new magazine. The feeding mechanism also comprises a device for feeding and inverting individual electrical connectors comprising a sloped feed path; a gate for holding a row of connectors; means for holding the row of connectors while a leading connector is allowed to advance along the feed path; and a tipping ledge and curved guide for inverting the lead connector as it advanced along the feed path.

26 Claims, 6 Drawing Sheets

(PRIOR ART)

APPARATUS AND METHOD FOR FEEDING CARD EDGE CONNECTORS AND CONNECTOR MAGAZINES

BACKGROUND OF THE INVENTION

1. Field of the Invention

This invention relates to electrical connectors and, more particularly, to an apparatus and method for feeding electrical connectors of the card edge type and connector magazines.

2. Prior Art

In the electrical arts it is common practice to use a connector to mechanically and electrically couple a mother printed circuit board with a daughter printed circuit board of the vertical edge card variety. Generally, card edge connectors such as the COMPUTER-BUS connectors, a trademark of Burndy Corporation, Norwalk, Conn., are packaged in clear PVC plastic tubes in side-by-side orientation. Burndy Corporation developed this side-by-side connector tube packaging especially for long connectors so as to overcome the disadvantage of old end-to-end packaging that allowed only a few connectors in a tube; the length of a card edge connector always being greater than the width of a card edge connector. Generally, the connectors are packaged in an upside-down position to protect the connector solder tails.

This side-by-side packaging of connectors, also known as high density packaging, provides a major advantage over the prior art in that high density connector magazines hold more connectors than end-to-end connector packaging magazines and thus, do not require to be replaced as often with a new magazine when connectors are finally emptied from a magazine. This reduces dependence on an operator to load a magazine feeder. The high density packaging, by using side-by-side packaging, results in connector tubes or magazines having as many as 60 connectors in a tube only 22 inches long. The magazines are generally used in an automatic feeder to feed connectors to an assembly robot that inserts the connectors into a mother printed circuit board.

A problem has arisen with the use of high density packaging and automatic feeders in that because high density connector magazines have many more connectors in them than the old end-to-end magazines, they are heavier than end-to-end connector magazines. Because of the heavier weight of the high density packaged magazines, not as many high density connector magazines could be stacked on top of each other in a magazine feeder as is known in the art. The heavy weight of stacked high density packaged connector magazines, generally more than six magazines stacked on top of each other, would damage the card edge connectors in the magazine at the bottom of the stack. Thus, although many more connectors could be packaged in the high density packaged magazines than in the old end-to-end type magazines, not as many high density packaged magazines could be stacked on top of each other as with the old end-to-end type magazines.

A further problem has arisen with the use of high density packaging connectors and automatic feeders in that as a bottom magazine in a feeder is emptied of connectors, feeding the connectors to the assembly robot, the weight of stacked magazines on a partially emptied bottom magazine would cause at least a portion of the bottom magazine to be crushed, inhibiting the further feeding of connectors from the bottom magazine.

A further problem has arisen in automatic feeders of card edge connectors from magazines having the connectors packaged in an upsidedown position in that further mechanisms are required to invert the connectors into an upright position before the connectors can be inserted into a mother printed circuit board. These inverting mechanisms add to the cost of an automatic feeder and require a great deal of maintenance.

It is therefore an object of the present invention to provide an automatic feeder of connector magazines that can have high density packaged connector magazines stacked therein without weight build-up on the bottom magazines of the stack.

It is a further object of the present invention to provide an automatic feeder of connector magazines that can have connector magazines stacked therein without risk of causing damage to connectors in the bottom magazines of the stack.

It is a further object of the present invention to provide an automatic feeder of connector magazines that can individually support a plurality of connector magazines in a stacked orientation.

It is a further object of the present invention to provide an automatic feeder of connector magazines which can have connector magazines loaded into the feeder by merely placing new connector magazines on top of a stack of connector magazines already in the feeder.

It is a further object of the present invention to provide an automatic feeder of connector magazines that can controllable advance a new magazine into a connector feeding position as desired.

It is a further object of the present invention to provide an automatic feeder of connector magazines that provides an accurate locating mechanism for positioning a connector magazine at a connector feeding position and which can also eject an empty magazine from the feeder.

It is a further object of the present invention to provide an electrical connector feeder that can invert connectors as the connectors are advanced to an assembly site.

SUMMARY OF THE INVENTION

The foregoing problems are overcome and other advantages are provided by a feeding mechanism for feeding electrical connector magazines and electrical connectors and a method of doing the same.

In accordance with one embodiment of the invention an electrical connector magazine feeder for feeding magazines having electrical connectors therein is provided. The feeder comprising worm gear means comprising at least two worm gears for holding and moving connector magazines therebetween, each worm gear comprising a center shaft and at least one helical flight extending therefrom; means for holding a connector magazine received from the worm gear means for dispensing of individual connectors, the holding means comprising a gate means having a first position for holding a connector magazine and a second position for allowing an empty connector magazine to be ejected from the holding means; and means for operably moving the worm gears and the gate means such that the worm gears can support connector magazines individually and can controllably advance connector magazines towards the holding means, and the gate means can be moved from the first position to the second position and back to the first position to allow an empty connector magazine to be ejected from the holding means for replacement with a new connector magazine from the worm gear means.

In accordance with another embodiment of the invention, a device for feeding and inverting individual electrical connectors is provided comprising a sloped connector feed path; gate means for holding a row of connectors with a first connector in a first position and a second connector in a second position, the gate means having an open position and a closed position, the open position allowing a first connector to move downward along the feed path from the gate means; holding means for holding a second connector at the second position to prevent movement therefrom while the gate means is open; and means downward from the gate means for inverting a connector comprising a tipping means to tip a connector onto its side and a curved guide means forming a portion of said feed path for further turning a connector as it advances along the curved guide means whereby a single connector can be fed from the row and individually inverted along a curved guide means.

In accordance with another embodiment of the invention, an electrical connector dispensing apparatus for dispensing electrical connectors from connector magazine is provided comprising means for individually feeding a plurality of connector magazines to an electrical connector dispensing position, the magazine feeding means comprising means for independently supporting a plurality of connector magazines during feeding and wherein the magazine feeding means feeds each connector magazine in unison and along a sequentially path; and means for individually feeding connectors from a magazine at the dispensing position to a work station, the connector feeding means having means for inverting each connector as each connector is being fed including a connector feed path having a curved guide portion for reorienting a connector along the curved portion.

In accordance with one method of the invention, a method is provided for manipulating a connector magazine in an electrical connector feeding apparatus comprising the steps of placing a connector magazine on top of at least two worm gears, each worm gear having a flight; turning the worm gears such that portions of the connector magazine move into open portions between the flights of each worm gear to load the magazine between the worm gears and be supported by the flights, the step of turning the worm gears further allowing the magazine to be fed along the flights as the worm gears are turned, the connector magazine exiting the worm gears as the magazine moves out from trailing edges of the flights; and supporting a magazine having exited the worm gears at a connector dispensing position having support gates to hold the magazine.

In accordance with another method of the invention, a method is provided for sequentially feeding and inverting electrical connectors comprising the steps of holding at least two connectors in a connector feed path behind a gate, a first of the connectors being located in front of a second of the connectors in the feed path; holding the second connector by a holding means thereby preventing the second connector from advancing along the feed path; opening the gate to allow the first connector to advance along the feed path; and inverting the first connector as it advances along the feed path wherein the feed path comprises a ledge to cause the first connector to turn onto its side and a curved path to further turn the first connector as the first connector advances along the feed path.

BRIEF DESCRIPTION OF THE DRAWINGS

The foregoing aspects and other features of the invention are explained in the following description, taken in connection with the accompanying drawings wherein.

DETAILED DESCRIPTION OF THE INVENTION

Figure 1:
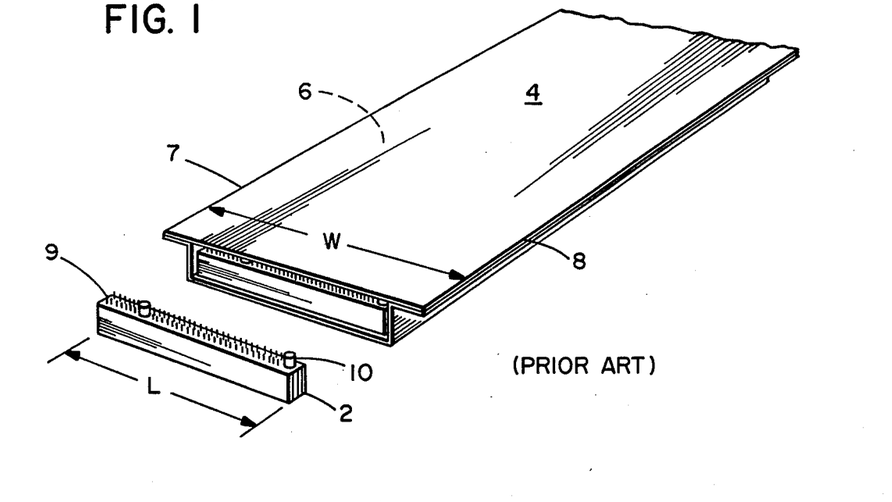
FIG. 1 is a partial perspective view of an electrical connector and a connector magazine.

Referring to FIG. 1, there is shown an electrical connector 2 of the vertical edge card type and a connector magazine 4 of the side-by-side connector orientation high density packaging type. The magazine 4 is generally comprised of clear PVC plastic tubing with a center chamber 6 for holding the electrical connectors 2 in side-by-side orientation. The magazine 4 also comprises two extending side ledges 7 and 8. As shown in FIG. 1, the electrical connectors 2 are generally packaged in the magazine 4 in an upsidedown position with solder tails 9 and mounting posts 10 in an upwardly extending position.

Figure 2:
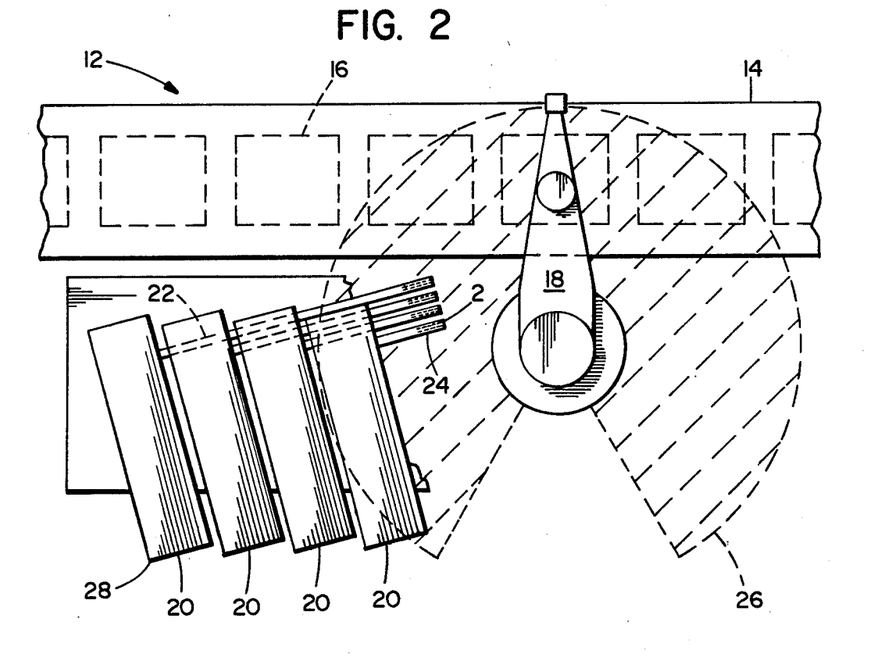
FIG. 2 is a schematic view of a robotic assembly station.
Figure 6:
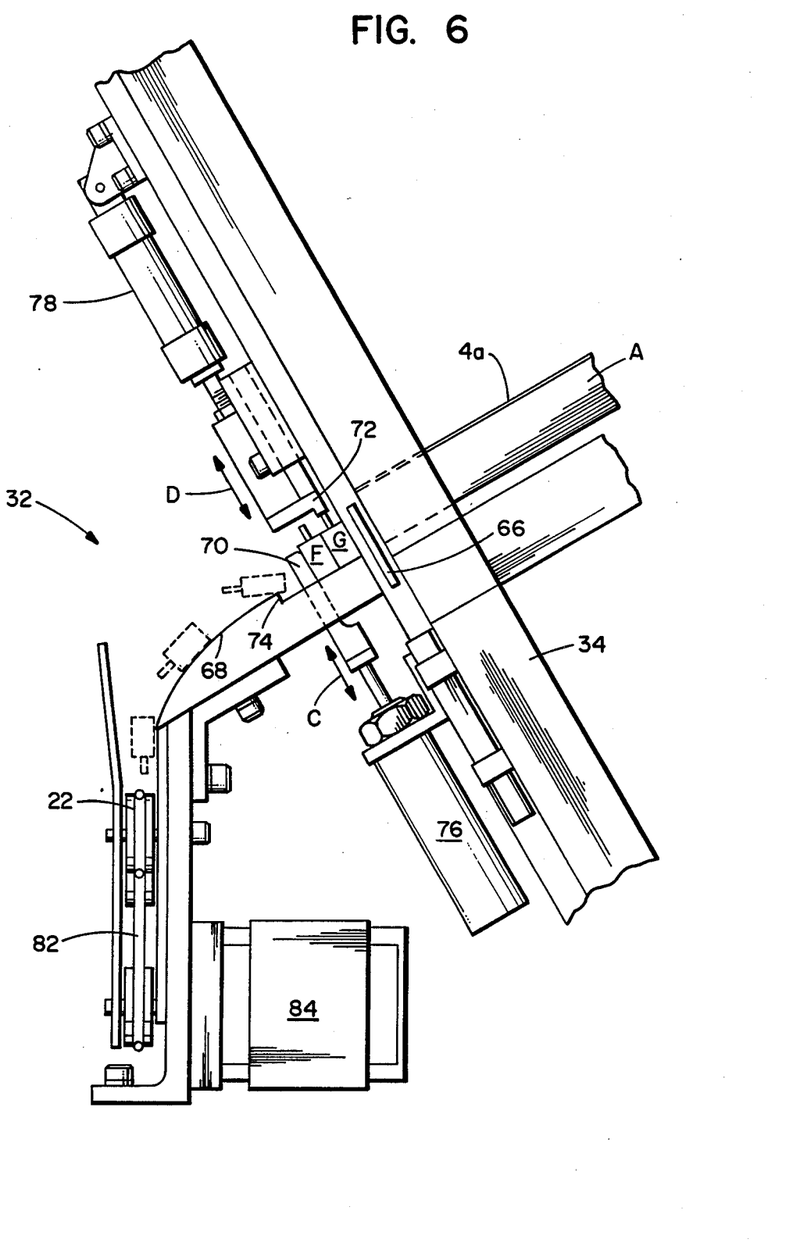
FIG. 6 is an enlarged schematic side view of the individual connector feeding and inverting section of the feeder shown in FIG. 3.

Referring now to FIG. 2, there is shown a schematic view of a robotic electrical connector assembly station 12. In the embodiment shown, the assembly station 12 generally comprises a printed circuit board conveyor 14 having a plurality of mother printed circuit boards 16 thereon, a robotic manipulator arm 18 and, in the embodiment shown, four feeding apparatus 20 for feeding electrical connectors 2 and connector magazines 4. As shown in this embodiment, each feeding apparatus 20 generally comprises a laterally extending conveyor 22 having an endless belt 82 and motor 84 (see FIG. 6) which can transport connectors 2 to a positioning nest 24 where the robotic manipulator arm 18 can pick up the connector 2, transport the connector to a mother board 16 and insert the connector 2 into the mother board 16 at a desired position. In the embodiment shown, a plurality of feeding apparatus 20 are generally provided such that each feeding apparatus can be loaded with a different type of electrical connector such that the manipulator arm 18 can insert different types of electrical connectors 2 into the mother boards 16 by merely picking up a different connector from one of the four positioning nests 24. The conveyor 22 can have any suitable length and is intended to hold a plurality of connectors therein in a row along the conveyor path. A sensor (not shown) at the positioning nest is capable of controlling the motor 84 as well as a feeding and inverting section 32 as will be described below. Although four feeding apparatus 20 are shown in this embodiment, any desired number of feeding apparatus may be provided. Also shown in FIG. 2 is the robotic arm reach area 26. This area 26 is also generally known as precious "real estate" in the automated robotic manufacturing industry. The area 26 must be utilized to its fullest extent in order to maximize efficiency of the assembly station 12. By positioning the feeding apparatus 20 in the off-set side-by-side positions shown and having laterally extending conveyor tracks 22 extending into the area 26 the precious "real estate" within the robotic arm reach area 26 is conserved. It also makes possible to group many feeders about the manipulator arm 18 such that maximum usage of the robot is derived. In addition, it also provides the shortest possible distance from the connector pick up position at the positioning nests 24 to the mother boards 16 on the circuit board conveyor 14. A further advantage in positioning the feeder apparatus 20 in the offset side-by-side orientation shown is that the arm reach area 26 of the manipulator arm 18 can also present a safety risk to workers attempting to load the feeder apparatus 20 with connector magazines 4 when the manipulator arm 18 is operating. The feeder apparatus 20, in the embodiment shown, are generally fed with connector magazines 4 from a rear side 28 of the feeders. Thus, in the embodiment shown, an operator can load the feeding apparatus 20 with new connector magazines 4 without substantial risk of injury from the movement of the robot 18.

Figure 3:
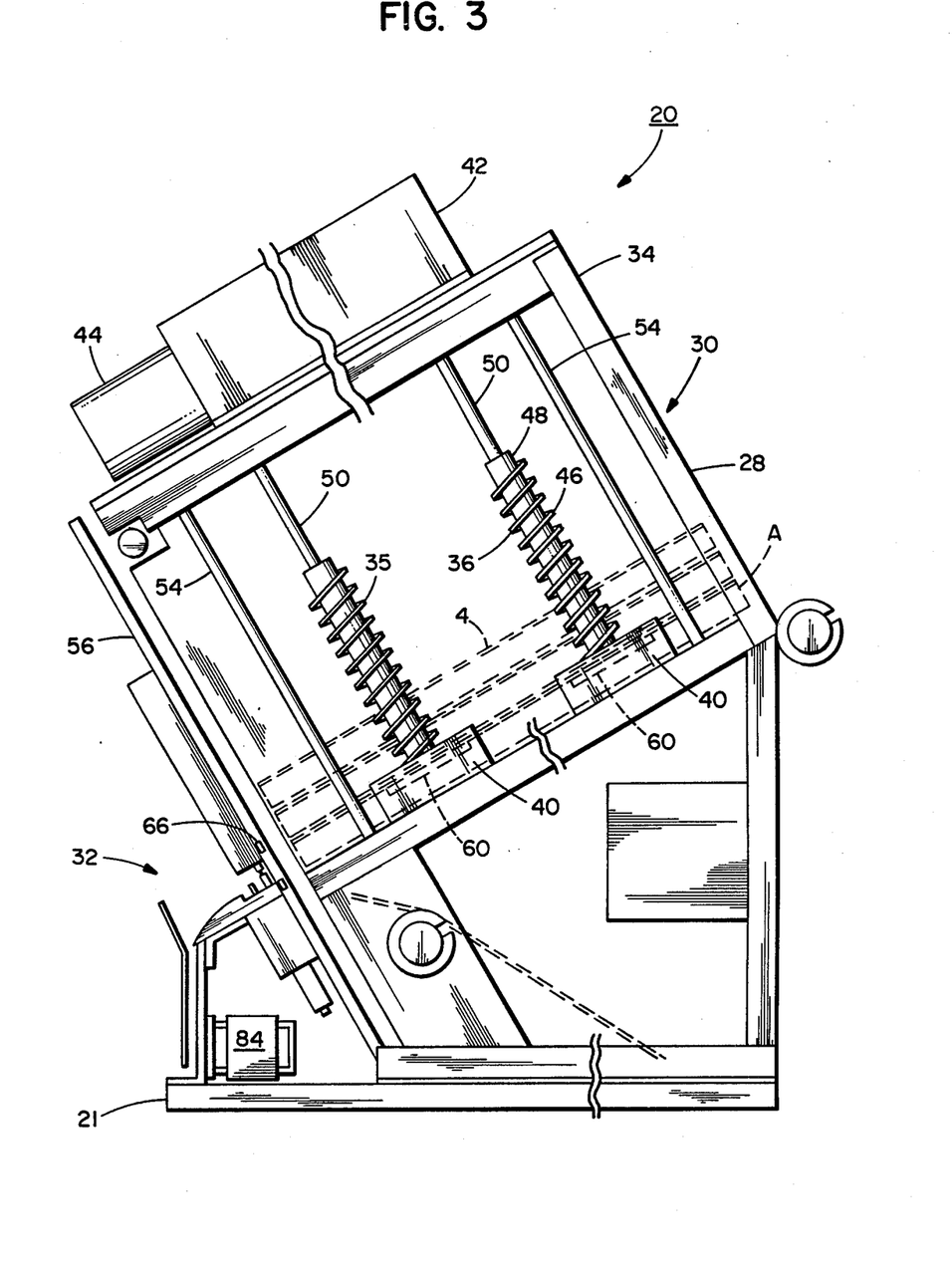
FIG. 3 is a schematic side view of a feeder incorporating features of the present invention.
Figure 4:
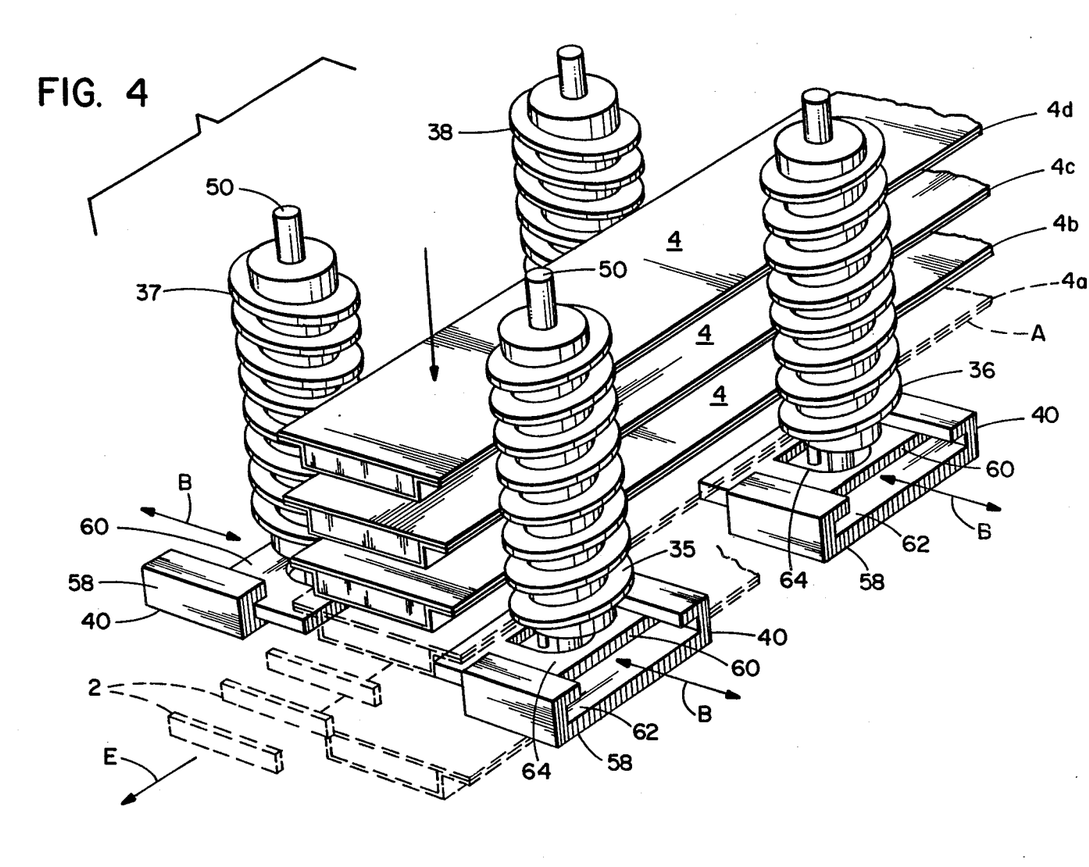
FIG. 4 is a partial perspective view of a magazine feeder of the feeder shown in FIG. 3.

Referring now to FIG. 3, there is shown a side view of one embodiment of a feeding apparatus 20 incorporating features of the present invention. In the embodiment shown, the feeding apparatus 20 generally comprises a magazine feeding section or magazine feeder 30 and an individual connector feeding and inverting section 32. Referring also to FIGS. 4, 5a, 5b and 5c, the magazine feeding section 30 will be further described. The magazine feeder 30, in the embodiment shown, generally comprises a frame 34, four worm gears 35, 36, 37 and 38, four magazine gates 40, one gate 40 under each of the worm gears 35, 36, 37 and 38, and a drive section 42 having an electric drive motor 44. Although four worm gears 35-38 are shown in this embodiment, any suitable number of worm gears maybe provided. Each of the worm gears generally comprises a helical flight 46, a center shaft 48, an upper extending shaft 50, a lower extending shaft 51, and a key pin 52 that extends from the bottom of the center shaft 48 offset from the lower extending shaft 51. Means are provided (not shown) for receiving and rotatably mounting the bottom of the lower extending shafts 51 with the frame 34. In a preferred embodiment of the invention, the mounting means (not shown) is adjustable as will be described below. The upper extending shafts 50 extend into the drive section 42. Suitable means are provided (not shown) in the drive section 42 for operably coupling the extending shafts 50 with the electric motor 44 such that the motor 44 can drive or rotate the worm gears 35–38. Also in a preferred embodiment of the invention, suitable means are provided (not shown) in the drive section 42 for adjustably mounting the upper extending shafts 50 with the electric motor as will be described below.

Figure 5A:
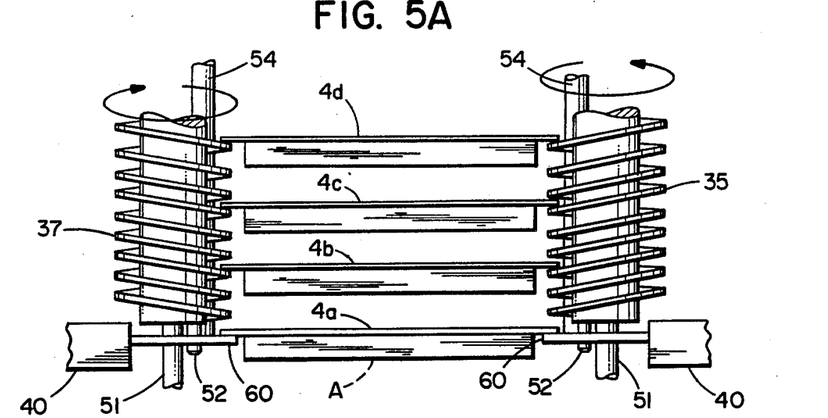
FIG. 5A is a schematic front view of the magazine feeder shown in FIG. 4.

As shown in this embodiment of the invention, connector magazines 4 can be positioned and held between a pair of worm gears. In the embodiment shown, the connector magazines 4 are positioned and held between a first forward pair of worm gears 35 and 37 and a second pair of rearward worm gears 36 and 38. The magazine feeder 30, in the embodiment shown, is generally capable of holding approximately ten connector magazines 4. Guide bars 54 are also also provided to form a central path for the connector magazines 4 to be positioned in. As shown in FIG. 3, the connector magazines 4 are held in the magazine feeder 30 at an angled position relative to a relatively horizontal base 21 of the feeding apparatus 20. A guide 56 prevents the connector magazines 4 from sliding from between the worm gears 35–38 and guide bars 54. In the embodiment shown, the magazine feeder 30 is generally capable of holding five connector magazines 4 between the worm gears 35–38 and an additional five connector magazines may be stacked on top of each other above the worm gears 35–38. However, in an alternate embodiment of the invention, the height of the flight section of the worm gears may be varied to provide support for more connector magazines or less connector magazines. In addition, the area above the flight section of the worm gears may also be varied. In the embodiment shown, the left pair of worm gears 37 and 38 have their flights 46 spiraling in a counter clockwise downward position. The right pair of worm gears 35 and 36 have their flights 46 spiraling in a clockwise downward direction. However, any direction of spiral can be provided for each of the worm gears. In this type of embodiment, the worm gears on the right side 35 and 36 of the connector magazine path are suitably connected to the drive section 42 such that they can be rotated in a counter clockwise direction as shown in FIG. 5a. The worm gears on the left side 37 and 38 of the connector magazine path are suitably connected to the drive section 42 for a clockwise rotation as shown in FIG. 5a. However, in alternate embodiments of the invention, all of the flights or some of the flights 46 may be provided with clockwise of counter clockwise downward spirals with the rotation of the worm gears at the drive section 42 for these type of worm gears being directed to move the magazines 4 downward. The worm gears 35–38 are suitably positioned such that the side ledges 7 and 8 of connector magazines can be supported by the flights 46. As the worm gears 35–38 are rotated the connector magazines 4, being supported on the flights 46, can be controllably advanced downward while also individually supporting each of the connector magazines 4 in the flight section of the worm gears 36–38. Thus, although the magazine feeder 30 may have as many as ten connector magazines stacked therein, the bottom five connector magazines are individually supported by the flights of the worm gears 35–38 and do not have the weight of upper connector magazines of the stack bearing thereon.

Located at the bottom of the worm gears 35–38 is a connector dispensing position A for dispensing individual electrical connectors 2 from a connector magazine 4. The connector dispensing position A is generally located beneath the worm gear flights with the gates 40 providing a means for supporting a connector magazine 4 in the connector dispensing position A. The gates 40 generally comprise a relatively stationary frame 58 and a laterally movable plate 60. However, in an alternate embodiment of the invention, any suitable type of support/gate can be provided. The frame 58 of each gate 40 generally comprises a guide path 62 for the plates 60 to move back and forth as indicated by arrows B. Suitable means are provided (not shown) for adjustably mounting the frames 58 to the frame 34 of the magazine feeder 30. This allows the gates 40 to be adjusted with the worm gears 35–38 relative to the connector magazine feeding path such that the magazine feeder 30 can accommodate connector magazines 4 with different widths W corresponding to connectors having different lengths L (see FIG. 1). The plate 60 of each gate 40 is slidably mounted with the frame 58 and comprises a general D-shaped central aperture 64. The lower extending shaft 51 as well as the key pin 52 for each worm gear pass through the D-shaped aperture 64. The key pin 52 is intended to make contact with the plate 60 in the central aperture 64 and move the plate 60 thereby.

Figure 5B:
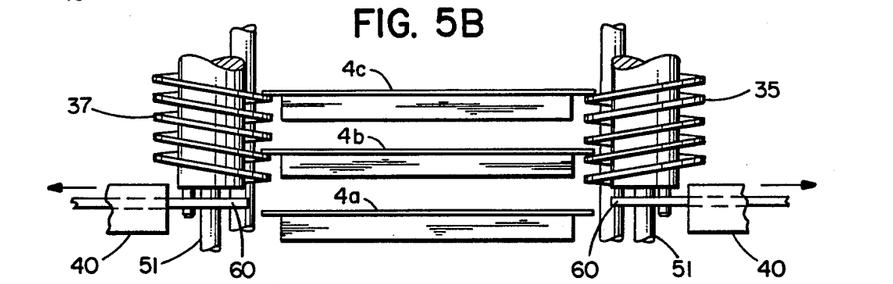
FIG. 5B is a schematic front view of the magazine feeder shown in FIG. 5A with its gates opened.
Figure 5C:
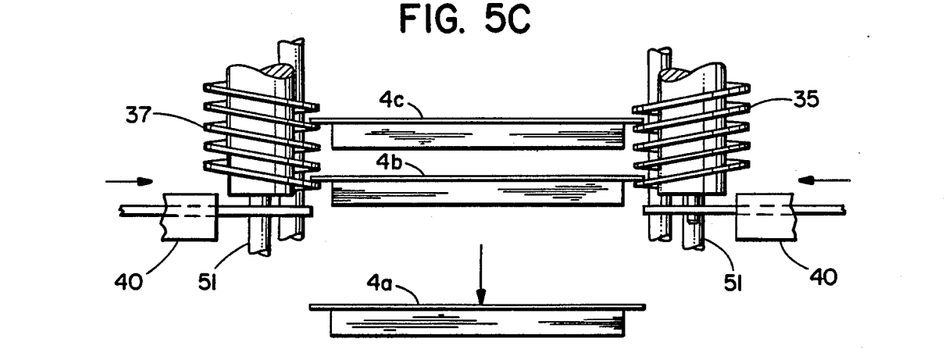
FIG. 5C is a schematic front view of the magazine feeder shown in FIG. 5B with an empty magazine being ejected and the stacked magazines being moved down in the flights of the worm gears.

Referring particularly to FIGS. 5a, 5b and 5c, the operation of the gates 40 will be further described. FIG. 5a generally shows connector magazines 4b, 4c and 4d being supported by the flights of the worm gears. The bottom magazine 4a is not supported by the worm gears, but rather, is supported by the plates 60 of the gates 40. The bottom magazine 4a is located at the bottom of the magazine stack in a connector dispensing position A. The magazine 4a in the connector dispensing position A is supported by the plates 60 which are in an inwardly extending position with the key pins 52 also in an inwardly extending position. With rotation of the worm gears 35 and 37 the key pins 52 are moved from their inward position to an outward position as shown in FIG. 5b. The key pins 52 make contact with the interior of the D shaped central aperture 64 in the plates 60 and cause the plates 60, with the cooperation of the guide paths 62 to laterally move outward from the connector stack path. The bottom most magazine 4a, having had the plates 60 moved, is no longer supported by the magazine feeder 30 and is allowed to drop from the magazine feeder as indicated in FIG. 5c. With further rotation of the worm gears 35 and 37 the key pins 52 are rotated back to their initial position as shown in FIG. 5a thereby moving the plates 60 back into the supporting position at the connector dispensing position A shown in FIG. 5a. As the worm gears rotate, a new connector magazine 4b is allowed to exit the worm gears as it comes off of a trailing edge of the flights 46 and drops onto the plates 60 at the connector dispensing position A. In a preferred embodiment of the invention, all of the worm gears 35–38 rotate in unison.

Generally, because the connector magazines 4 are at an angled position at the connector dispensing position A the connectors 2 can merely be gravity fed from the magazine as desired. Generally, in the embodiment shown, the connectors 2 from a connector magazine at the connector dispensing position A are gravity fed as indicated by arrow E in FIG. 4 to the connector feeding and inverting section 32. The plates 60 generally provide a stable and secure platform for the magazine in the connector dispensing position A to rest on. The plates 60 also allow the feeding connector magazine 4a to be aligned with the feed path 68 such that the connectors can merely slide onto the feed path 68 (see FIG. 6). A sensor 66 such as an optical sensor is capable of sensing the absence of a connector in the feed path between the connector magazine 4 at the connecting dispensing position A and the connector feeding and inverting station 32, thus indicating that the connector magazine 4 at the connector dispensing position A is empty. The sensor 66 is suitably connected to the electric motor 44 or other control mechanism (not shown) to initiate the drive section 42 to open the gates 40 and eject the empty connector magazine at the connector dispensing position A, controllably advance the connector magazines 4 in the connector stack downward with a new full connector magazine 4 being exited from the worm gears 35–38 onto the plates 60 and into the connector dispensing position A such that electrical connectors 2 can be substantially continuously provided to the connector feeding and inverting section 32. An operator, in order to load the magazine feeder 30 can insert new connector magazines 4 into the magazine feeder at the rear side 28 by merely stacking the connector magazines 4 on top of the worm gears 35–38 without having to actually place the ledges 7 and 8 between the flights 46. With the rotation of the worm gears 35–38 the leading edges of the flights 46 will automatically load the ledges 7 and 8 between the flights. As described above, the worm gears 35–38, gates 40, guide bars 54 and drive coupling at the drive section 42 are all adjustable to accommodate different lengths L of connectors 2 which are packaged in different width W magazines 4.

Thus, the feeding apparatus 20 can be varied for loading and use with any length of connector. Another sensor (not shown) may be provided to signal an operator when there remains only one magazine in the magazine feeder 30 such that the operator can reload the magazine feeder 30 with new magazines.

Referring now to FIGS. 6, 7a, 7b, and 7c, the individual connector feeding and inverting section 32 will be further described. In the embodiment shown, the connector feeding and inverting section 32 generally comprises a sloped connector feed path 68, a solenoid activated gate 70, a solenoid activated holder 72 and a tipping ledge 74. Generally, individual connectors 2 from a connector magazine 4 at the connector dispensing position A are gravity fed in a row into the feeding and inverting section 32. The gate 70 generally prevents the row of connectors 2 from advancing. A solenoid 76 is operable to move the gate 70 up and down as indicated by arrow c. The holder 72 is generally capable of clamping the second connector G in the row between the holder 72 and the feed path 68 such that neither the second connector G nor the other connectors located behind the second connector are capable of advancing along the feed path 68. A second solenoid 78 is operably connected to the holder 72 to move the holder 72 in an up and down direction as indicated by arrow D.

Figures 7A, 7B, 7C:
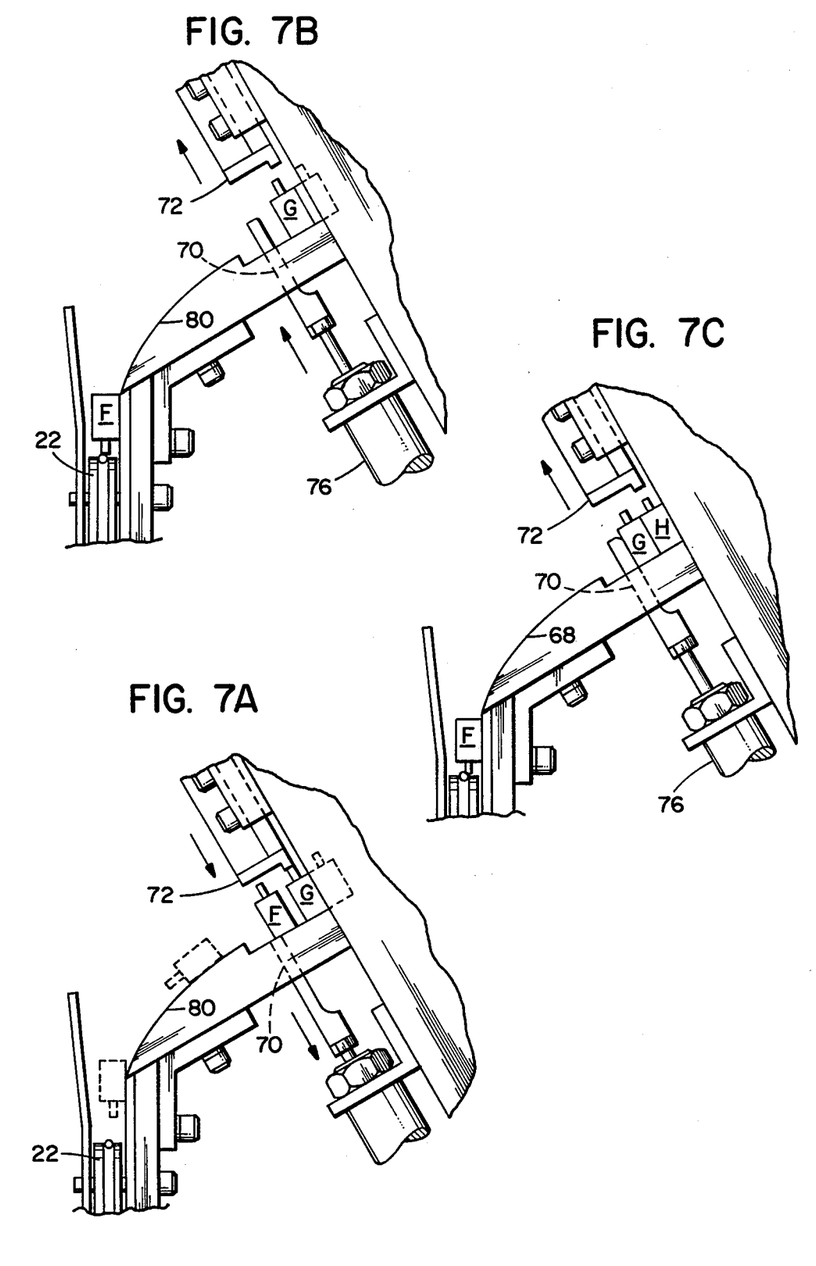
FIG. 7A is a partial schematic side view of the feeder section shown in FIG. 6 with the feeder gate down.
FIG. 7B is a partial schematic side view of the feeder section of FIG. 7A with the feeder gate up, the holder up and new connectors being slid towards the feeder gate.
FIG. 7C is a partial schematic side view of the feeder section of FIG. 7B at a home position.

In operation, when a sensor (not shown) located at the positioning nest 24 (see FIG. 2) indicates the absence of a electrical connector 2 at the positioning nest 24, the second solenoid 78 is activated to move the holder 72 downward onto a second connector G in the connector row thereby holding the second connector in its position. The connectors located behind the second connector are also held correspondingly in their positions being unable to advance without the second connector first being advanced. The first solenoid 76 is then activated to move the gate 70 from its up position shown in FIG. 6 to a down position as shown in FIG. 7a. The first connector F is now able to advance along the sloped feed path 68. The first connector F generally slides along the feed path 68 by a gravity feed until it hits the tipping ledge 74. At this point gravity, weight, balance and inertia combine to topple first connector F onto its side onto a curved section 80 of the sloped connector feed path 68. The path of the connectors is generally shown in dashed lines in FIGS. 6 and 7a. The first connector F continues to be gravity fed along the curved section 80 of the feed path 68 until it is slid onto the conveyor 22 at which point the tipping ledge 74 and curve section 80 of the feed path have substantially inverted the connector into a right side-up position. The conveyor 22 is then able to convey the connector to the positioning nest 24. The first solenoid 76 is then activated to move the gate 70 back to its up position as shown in FIG. 7b. The second solenoid 78 is also activated to move the holder 72 to an up position such that the second connector G and the other connectors located behind the second connector G can advance to the gate 70 as shown in FIG. 7c and a new connector H moves into the old second connector's position under the holder 72.

The feeding and inverting section 32 allows individual connectors 2 to be inverted from their upsidedown position in the connector magazines 4 to an upright position in the conveyor 22 without any moving parts or maintenance requiring mechanisms. In addition, because of the relatively gentle inverting of the connectors, there is substantially little risk of damage to the solder tails 9 of the connector 2. In a preferred embodiment, the holder 72 is designed to make contact with the mounting posts 10 of the connectors 2 without damaging the solder tails 9. In an alternate embodiment of the invention, the holder 72 may be replaced with any other suitable holding means. Also in an alternate embodiment of the invention, the gate 70 may be replaced with any other suitable gate means. In a preferred embodiment of the invention, the feed path 68 also comprises adjustable side walls (not shown) to channel the connectors along the feed path as they advance. The side walls (not shown) can be adjustable to accommodate different length connectors.

The present invention generally allows for a considerable number of connector magazines to be stacked on top of each other without risk of damage to connectors in the lower magazines of the stack. Stacking of the magazines in this fashion also reduces operator loading time and loading intervals. In addition, new connector magazines can be loaded by merely placing magazines on top of the worm gear screw flights with the flights feeding themselves with the magazines as the worm gears turn. In addition, the present invention provides an easy, inexpensive and virtually maintenance free method and apparatus for inverting connectors through the use of gravity, weight, balance and inertia.

It should be understood that the foregoing description is only illustrative of the invention. Various alternatives and modifications can be devised by those skilled in the art without departing from the spirit of the invention. Accordingly, the present invention is intended to embrace all such alternative, modifications and variances which fall within the scope of the appended claims.

What is claimed is:

1. An electrical connector magazine feeder for feeding magazines have electrical connectors therein, the feeder comprising:

worm gear means comprising at least two worm gears for holding and moving connector magazines therebetween, each worm gear comprising a center shaft and at least one helical flight extending therefrom;

means for holding a connector magazine received from said worm gear means for dispensing of individual connectors, said holding means comprising a gate means have a plate positioned under said flights of each of said worm flights and being mounted for lateral movement relative to a central feeding axis formed between said worm gears, each of said plates comprising a center aperture for passage of a portion of one of said center shafts therethrough and for operably receiving a keying portion from one of said worm gears, said keying portions and said center apertures cooperating to move said plates as said worm gears are rotated, said gate means having a first position for holding a connector magazine and a second position for allowing an empty connector magazine to be ejected from said holding means; and means for operably moving said at least two worm gears and said gate means such that said worm gears can support connector magazines individually and can controllably advance connector magazines towards said holding means, and said gate means can be moved from said first position to said second position and back to said first position to allow an empty connector magazine to be ejected from said holding means for replacement with a new connector magazine from said worm gear means.

2. A feeder as in claim 1 wherein said worm gear means comprises two pairs of worm gears.

3. A feeder as in claim 1 wherein said moving means comprises a key means operably connecting said worm gears with said gate means for unison movement therebetween.

4. A feeder as in claim 1 wherein said helical flights are suitably sized and shaped to receive side ledges of connector magazines.

5. A feeder as in claim 1 wherein said moving means comprises means for rotating said worm gears in unison.

6. A feeder as in claim 1 wherein said worm gear means can support a plurality of connector magazines individually in a relatively vertical column along said worm gears with said flights preventing weight from upper connector magazines in the column from damaging connector magazines at the bottom of the column.

7. A feeder as in claim 1 wherein said worm gear means comprises means for loading new connector magazines into said worm gears such that a plurality of new connector magazines can be stacked on top of said worm gears and fed into said worm gears as empty connector magazines are ejected from the feeder.

8. A feeder as in claim 1 further comprising means for sensing the absence of connectors in a connector magazine at said holding means.

9. A feeder as in claim 8 wherein said sensor means is operably connected to said moving means such that said sensor means can signal said moving means to eject an empty connector magazine and position a new magazine into said holding means when said sensor means senses the absence of connectors.

10. A feeder as in claim 1 wherein said at least two worm gears are movable relative to each other such that the feeder can be used with different size connector magazines.

11. An electrical connector dispensing apparatus for dispensing electrical connectors from connector magazines comprising:
an electrical connector magazine feeder as in claim 1; and
means for individually feeding connectors from a magazine at a dispensing position to a work station, said connector feeding means having means for inverting each connector as each connector is being fed including a connector feed path having a curved guide portion for reorienting a connector along said curved portion.

12. An apparatus as in claim 11 wherein said magazine feeding means comprises at least two worm gear feeding mechanisms having flights for supporting connector magazine thereon.

13. An apparatus as in claim 11 wherein said connector feeding means also comprises a tipping means for tipping a connector onto its side and onto said curved guide portion.

14. An apparatus as in claim 11 wherein said connector feeding means comprises:
second gate means for holding row of connectors with a first connector in a first position and a second connector in a second position, said second gate means having an open position and a closed position, said open position allowing a first connector to move downward along said feed path from said second gate means;
holding means for holding a second connector at said second position to prevent movement therefrom while said second gate means is open; and
means downward from said second gate means for inverting a connector comprising a tipping means to tip a connector onto its side and a curved guide means forming a portion of said feed path for further turning a connector as it advances along the curved guide means whereby a single connector can be fed from said row and individually inverted along said curved guide means.

15. An apparatus as in claim 14 wherein said connector feed path is sufficiently sloped to allow a first connector to gravity slide along said feed path between said first position and said tipping means.

16. An apparatus as in claim 15 wherein said tipping means comprises an extending ledge such that when a first connector slides to said tipping means inertia, gravity and balance cause a first connector to topple onto said ledge.

17. An apparatus as in claim 14 wherein said feed path can feed connectors in an upside-down orientation to prevent damage to solder tails on connectors and can invert connectors without substantial risk of damage to solder rails without the use of moving parts along the feed path.

18. An apparatus as in claim 14 wherein said curved guide means terminates with connectors in a rightside-up position in a laterally extending conveyor for conveying connectors to a work station.

19. An apparatus as in claim 18 wherein a plurality of feeding and inverting devices can be placed in side-to-side orientation with a plurality of corresponding lateral conveyors in side-to-side orientation to convey a plurality of connectors to a work station at substantially the same time in a relatively minimum amount of space.

20. A feeder as in claim 6 wherein said worm gear means can support connector magazines in a substantially angled orientation.

21. A feeder as in claim 20 wherein said means for holding comprises a forward guide to prevent connector magazines from sliding from between said worm gear means.

22. A feeder as in claim 1 wherein each of said plate apertures is D-shaped.

23. A feeder as in claim 1 wherein said keying portions each comprise a pin extending down from said flights.

24. A feeder as in claim 6 wherein said worm gear means support connector magazines in an angled column.

25. A feeder as in claim 1 wherein said means for holding a connector magazine for dispensing of connectors holds the magazine at an angled orientation for gravity feeding of connectors from the magazine.

26. An apparatus for feeding objects comprising:
a frame;
two worm gears axially rotatably connected to said frame, said worm gears each having a flight section and forming a central feeding path between said worm gears for holding and moving objects through said path;
two platform plates movably connected to said frame for reciprocating linear movement, each one of said plates being located under one of said worm gear flight sections and being operably moveable, at least partially, into and out of said central feeding path, each plate comprising a key receiving portion;
means for axially rotating said two worm gears; and
means for operably moving said two plates in response to predetermined axial rotation of said two worm gears including a moving key member connected to each one of said worm gears, said key members being cooperatable with said plate key receiving portions to move said plates into said central feeding path upon a first predetermined axial rotation of said worm gears, and to move said plates out of said central feeding path upon a second predetermined axial rotation of said worm gears.

* * * * *